(12) United States Patent
Ellison (10) Patent No.: US 7,275,937 B2
(45) Date of Patent: Oct. 2, 2007

(54) OPTOELECTRONIC MODULE WITH COMPONENTS MOUNTED ON A FLEXIBLE CIRCUIT

(75) Inventor: Thomas Lee Ellison, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/836,728

(22) Filed: Apr. 30, 2004

(65) Prior Publication Data

US 2005/0245103 A1 Nov. 3, 2005

(51) Int. Cl.
H01R 12/00 (2006.01)

(52) U.S. Cl. .............................................. 439/67

(58) Field of Classification Search ............... 439/367, 439/577, 62, 86, 67, 59, 74, 492, 637; 385/88, 385/92, 114
See application file for complete search history.

(56) References Cited

U.S. PATENT DOCUMENTS

| | | | |
|---|---|---|---|
| 3,271,214 A | 9/1966 | Tabor | |
| 3,987,676 A | 10/1976 | Bennewitz | |
| 4,092,061 A | 5/1978 | Stigliani, Jr. | |
| 4,128,697 A | 12/1978 | Simpson | |
| 4,375,578 A | 3/1983 | Mitchell et al. | |
| 4,769,684 A | 9/1988 | Crocker et al. | |
| 4,815,990 A * | 3/1989 | Ristedt et al. | 439/496 |
| 4,818,099 A | 4/1989 | Preikschat et al. | |
| 4,952,016 A | 8/1990 | Adams et al. | |
| 4,953,006 A | 8/1990 | Kovats et al. | |
| 4,962,991 A | 10/1990 | Carvalho | |
| 5,125,054 A | 6/1992 | Ackley et al. | |
| 5,136,682 A | 8/1992 | Moyer et al. | |
| 5,212,345 A | 5/1993 | Gutierrez | |
| 5,249,245 A | 9/1993 | Lebby et al. | |
| 5,253,311 A | 10/1993 | Killen et al. | |
| 5,299,276 A | 3/1994 | Okamura et al. | |
| 5,359,686 A | 10/1994 | Galloway et al. | |
| 5,361,317 A | 11/1994 | Hartman et al. | |
| 5,371,820 A | 12/1994 | Welbourn et al. | |
| 5,371,822 A | 12/1994 | Horwitz et al. | |
| 5,375,184 A | 12/1994 | Sullivan | |
| 5,389,686 A | 2/1995 | Diop et al. | |

(Continued)

FOREIGN PATENT DOCUMENTS

GB 0 881 671 12/1998

(Continued)

OTHER PUBLICATIONS

U.S. Appl. No. 10/409,837, filed Apr. 9, 2003, Kumar et al.

(Continued)

*Primary Examiner*—Chandrika Prasad
(74) *Attorney, Agent, or Firm*—Workman Nydegger (57) ABSTRACT

Embodiments of the present invention disclose a transceiver module having a flexible circuit contained within a housing. The flexible circuit has various electronic components and either a photodiode or a laser transmitter disposed on and electrically connected to it. In alternate exemplary embodiments, both a photodiode and a laser are disposed on and connected to the flexible circuit. In addition, there can be electrical contacts disposed on and electrically connected to the flexible circuit. These electrical contacts can take the form of pads that are a standard form factor pluggable configuration, such as the Multisource Agreement Standard Form Factor Pluggable (MSA SFP) standard.

20 Claims, 4 Drawing Sheets

U.S. PATENT DOCUMENTS

| | | | |
|---|---|---|---|
| 5,409,384 A * | 4/1995 | Green et al. .................. | 439/67 |
| 5,414,786 A | 5/1995 | Ohta et al. | |
| 5,420,954 A | 5/1995 | Swirhun et al. | |
| 5,428,190 A | 6/1995 | Stopperan | |
| 5,432,630 A | 7/1995 | Lebby et al. | |
| 5,452,182 A * | 9/1995 | Eichelberger et al. ...... | 361/749 |
| 5,471,552 A | 11/1995 | Wuu et al. | |
| 5,495,125 A | 2/1996 | Uemura | |
| 5,499,312 A | 3/1996 | Hahn et al. | |
| 5,539,848 A | 7/1996 | Galloway | |
| 5,545,846 A | 8/1996 | Williams et al. | |
| 5,596,662 A | 1/1997 | Boscher | |
| 5,613,024 A | 3/1997 | Shahid | |
| 5,625,734 A | 4/1997 | Thomas et al. | |
| 5,638,469 A | 6/1997 | Feldman et al. | |
| 5,666,449 A | 9/1997 | Sawae et al. | |
| 5,703,895 A | 12/1997 | Ghirardi et al. | |
| 5,706,378 A | 1/1998 | Suzuki et al. | |
| 5,717,800 A | 2/1998 | Funabashi | |
| 5,774,614 A | 6/1998 | Gilliland et al. | |
| 5,844,783 A | 12/1998 | Kojima | |
| 5,894,409 A | 4/1999 | Tanaka | |
| RE36,325 E * | 10/1999 | Corbett et al. .............. | 257/685 |
| 5,974,214 A | 10/1999 | Shacklette et al. | |
| 5,996,222 A * | 12/1999 | Shangguan et al. .......... | 29/840 |
| 6,011,695 A | 1/2000 | Dumke | |
| 6,040,624 A | 3/2000 | Chambers et al. | |
| 6,045,269 A | 4/2000 | Watanabe et al. | |
| 6,069,991 A | 5/2000 | Hibbs-Brenner et al. | |
| 6,088,498 A | 7/2000 | Hibbs-Brenner et al. | |
| 6,091,475 A * | 7/2000 | Ogino et al. ................ | 349/149 |
| 6,118,666 A | 9/2000 | Aoki et al. | |
| 6,195,261 B1 | 2/2001 | Babutzka et al. | |
| 6,268,231 B1 * | 7/2001 | Wetzel ....................... | 438/48 |
| 6,305,848 B1 * | 10/2001 | Gregory ..................... | 385/53 |
| 6,326,553 B1 | 12/2001 | Yim et al. | |
| 6,380,493 B1 | 4/2002 | Morita et al. | |
| 6,404,960 B1 | 6/2002 | Hibbs-Brenner et al. | |
| 6,473,314 B1 | 10/2002 | Custer et al. | |
| 6,483,712 B1 * | 11/2002 | Oliphant et al. ............ | 361/737 |
| 6,485,322 B1 * | 11/2002 | Branch et al. .............. | 439/357 |
| 6,521,989 B2 | 2/2003 | Zhou | |
| 6,586,678 B1 | 7/2003 | Rosenberg et al. | |
| 6,617,518 B2 | 9/2003 | Ames et al. | |
| 6,703,561 B1 | 3/2004 | Rosenberg et al. | |
| 6,709,607 B2 | 3/2004 | Hibbs-Brenner et al. | |
| 6,860,649 B2 * | 3/2005 | Edwards et al. ............. | 385/92 |
| 6,867,377 B2 * | 3/2005 | Anderson et al. ........... | 174/254 |
| 2002/0170742 A1 | 11/2002 | Liaw et al. | |
| 2003/0102157 A1 | 6/2003 | Rosenberg et al. | |
| 2003/0197254 A1 | 10/2003 | Huang | |
| 2004/0018409 A1 | 1/2004 | Hui et al. | |
| 2004/0062491 A1 * | 4/2004 | Sato et al. ................... | 385/88 |
| 2004/0090620 A1 | 5/2004 | Farr | |
| 2004/0092135 A1 * | 5/2004 | Hofmeister et al. .......... | 439/39 |
| 2004/0202214 A1 | 10/2004 | Aronson et al. | |
| 2005/0045374 A1 | 3/2005 | Kumar et al. | |
| 2005/0242160 A1 | 11/2005 | Nippa et al. | |
| 2005/0244095 A1 * | 11/2005 | Ellison ....................... | 385/14 |
| 2005/0245118 A1 | 11/2005 | Liu et al. | |
| 2005/0265650 A1 * | 12/2005 | Priyadarshi et al. .......... | 385/14 |
| 2006/0062526 A1 * | 3/2006 | Ikeuchi ....................... | 385/88 |

FOREIGN PATENT DOCUMENTS

| | | |
|---|---|---|
| GB | 0 905 838 | 3/1999 |
| JP | 62-114545 | 5/1987 |
| JP | 03-0148190 | 6/1991 |
| JP | 406034838 | 2/1994 |
| JP | 407159636 | 6/1995 |
| JP | 09-223848 | 8/1997 |
| WO | 92/00538 | 1/1992 |

OTHER PUBLICATIONS

U.S. Appl. No. 11/179,223, filed Jul. 11, 2005, Ice.

Murata, S., Nishimura, K., *Improvement in Thermal Properties of a Multi-Beam Laser Diode Array*, Japanese Journal of Applied Physics, vol. 28, Suppl. 28-3, pp. 165-170 (1989).

Ali, "New Materials and Design Components for Integrated Optics," Technology Report/Fiberoptics, Laser Focus World, vol. 21, No. 8, Aug. 1985, Tulsa, U.S., pp. 48 and 50.

Cohen, "Passive Laser-Fiber Alignment by Index Method," IEEE Photonics Technology Letters, vol. 3, No. 11, Dec. 1991, pp. 985-987, New York, U.S.

Coldren, et al., "Flip-Chip Bonded, Back-Emitting, Microlensed Arrays of Monolithic Vertical Cavity Lasers and Resonant Photodetectors," Electronic Components and Technology Conference, Sep. 1999, pp. 733-740.

Havant, "Flexible Interposing Carrier Scheme for Optical Waveguides," Research Disclosure No. 303, Jul. 1989, p. 512.

Hibbs-Brenner, et al., "Packaging of VCSEL Arrays for Cost-Effective Interconnects at <10 Meters," Electronic Components and Technology Conference, Sep. 1999, pp. 747-752.

Hsu, et al., "Flip-chip Approach to Endfire Coupling Between Single-Mode Optical Fibres and Channel Waveguides," Patent Associated Literature, Electronics Letters, vol. 12, No. 16, pp. 404-405, Aug. 5, 1976.

Kazlas, et al., "Monolithic Vertical-Cavity Laser/p-i-n Photodiode Transceiver Array for Optical Interconnects," IEEE Photonics Technology Letters, Nov. 1998, pp. 1530-1532, vol. 10, No. 11.

Louderback, et al., "Flip Chip Bonded Arrays of Monolithically Integrated, Microlensed Vertical-Cavity Lasers and Resonant Photodetectors," IEEE Photonics Technology Letters, Mar. 1999, pp. 304-306, vol. II, No. 3.

Plawsky, et al., "Photochemically Machined, Glass Ceramic, Optical Fiber Interconnection Components," Article, Optoelectronic Materials, Devices, Packaging and Interconnects (1988), SPIE, vol. 994, pp. 101-106.

Sullivan, et al., "Polymeric Waveguides," 1992 IEEE, pp. 27-31.

* cited by examiner

OPTOELECTRONIC MODULE WITH COMPONENTS MOUNTED ON A FLEXIBLE CIRCUIT

CROSS-REFERENCE TO RELATED APPLICATIONS

This application is related to U.S. Utility patent application Ser. No. 10/836,134 filed on Apr. 30, 2004 and entitled "Integrated Optical Sub-Assembly Having Epoxy Chip Package", which is incorporated by reference.

BACKGROUND OF THE INVENTION

1. The Field of the Invention

Exemplary embodiments of the present invention relate to transceiver modules, and more specifically, to transceiver modules constructed using flexible circuitry in place of a printed circuit board.

2. The Relevant Technology

Transceiver modules come in a variety of shapes and sizes depending on the specific function they are designed to perform. Optoelectronic transceiver modules typically contain a transmitter optical sub-assembly (TOSA), a receiver optical sub-assembly (ROSA), and a printed circuit board (PCB) that controls the TOSA and ROSA. This PCB also connects the transceiver module to external devices using the various electrical circuits associated with the PCB.

Various standards setting organizations define the size and shape of optical transceivers. As with most electronic components, over the past several years the size of optical transceivers has been shrinking as electronics engineers fit more and more electrical circuitry into smaller and smaller packages. Unfortunately, as the number of electrical components and the tolerances between components on a PCB increases, and particularly as the density of these components increases, the manufacturing complexity and expense correspondingly increase.

PCBs are typically composed of a substrate, such as glass, plastic, or silicon, on which are printed or etched electrical circuits. In an attempt to alleviate the complexity and expense associated with filling one side of a PCB with circuits, designers can put circuits on both sides of the PCB. While this helps ease the premium on space, it even further complicates the manufacturing process.

Additionally, no matter how small PCBs become, they have limited space to receive electrical circuits. Also, the size of the PCB is limited by the size of the transceiver package; this size governed by industry standards. Even with sophisticated techniques to pack the most electrical circuitry possible onto the PCB, the physical space limitations presented by the device standards cannot be overcome. As the density of the circuitry increases, the costs of manufacture increase substantially.

Providing an optimal connection between a TOSA and/or a ROSA and a PCB can be difficult. For example, within a transceiver module, the TOSA and the ROSA must be positioned accurately within small tolerances to achieve the desired optical performance. Similarly, the PCB must typically be precisely positioned for its connections to adjacent devices. Adding a third layer of rigid alignment requirements (the PCB to the TOSA and/or ROSA) makes accurately positioning the internal components difficult. Additionally, the TOSA and the ROSA often experience vibration and movement as optical cables are moved, attached, and detached. The PCB may be damaged or even crack if it rigidly attaches to the TOSA and/or ROSA at one end and a transceiver module housing at the other. Thermal contraction or expansion can also cause problems if the devices are rigidly attached.

To eliminate some problems with manufacturing a transceiver, flexible circuits may be disposed between the TOSA and/or ROSA and the PCB. The flexible circuit electrically interconnects the TOSA, ROSA, and PCB while isolating the PCB from vibration, thermal expansion or contraction of the adjacent devices. During production, the PCB may be mechanically fixed in place while the TOSA and/or ROSA are free to move. Use of the flexible circuit accommodates for variations in device subassembly position and enables precise connection and alignment of the TOSA, ROSA, and the PCB.

To contain and protect the active devices within the TOSA and/or ROSA, the TOSA and/or ROSA may include a transistor-outline (TO) header. The TO header allows the electrical connection of the active devices in the TOSA and/or ROSA to the PCB, such as by way of a flexible circuit board or otherwise. With respect to their construction, TO headers often include a cylindrical metallic base with a number of conductive pins extending completely through, and generally perpendicular to, the base. One conventional method of conductively connecting a flexible circuit to a TO header includes pins on the TO header that connect to reinforced openings on one end of the flexible circuit, which are then soldered to affix the flexible circuit and ensure reliable connections. In turn, the other end of the flexible circuit attaches to "finger" like traces on the rigid PCB, via soldering or otherwise. Such soldered contacts are typically aligned in a linear-row along the edge of the PCB.

Figure 1:
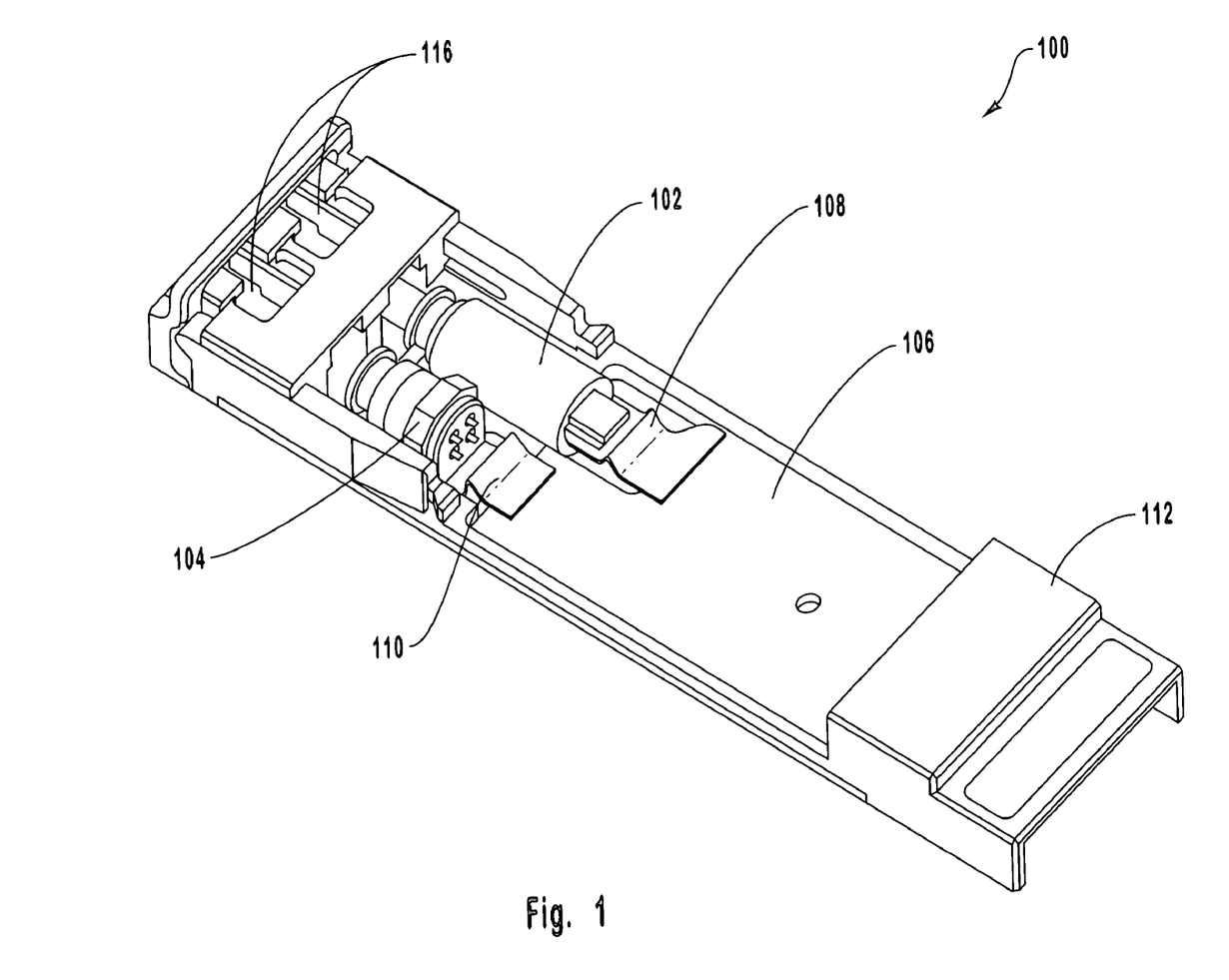
FIG. 1 illustrates a perspective view of a typical optoelectronic module with a printed circuit board.

The general construction of such an optoelectronic module 100 is shown in FIG. 1. Optoelectronic module 100 includes a TOSA 102 and a ROSA 104 that connect to a printed circuit board 106. A first flexible circuit 108 interconnects TOSA 102 and printed circuit board 106, while a second flexible circuit 110 interconnects ROSA 104 and printed circuit board 106. Also depicted as part of module 100 are housing 112 for containing the electrical components of module 100 and Lucent Connector (LC) cable receptacles 116, or other fiber optic cable connectors such as standard connectors (SC), for receiving and securely attaching LC cables (not shown) to TOSA 102 and ROSA 104.

The entire optoelectronic module 100 connects to a computer system that controls the operation of the transceiver module. The computer system, such as a host system, can direct module 100 to transmit an optical signal by directing an electronic signal through PCB 106 and into TOSA 102. The TOSA 102 then generates an optical signal via an internal laser or light emitting diode (LED) that propagates into an outgoing optical cable at port 116. Similarly, ROSA 104 receives an optical signal via a photodiode from the incoming optical cable at port 116 and transmits the signal to PCB 106 and on to the computer system. Specific details of the connection of flexible circuits to PCBs can be found in co-pending and co-owned U.S. Pat. application Ser. No. 10/409,837, filed on Apr. 9, 2003 and entitled "Flexible Circuit for Establishing Electrical Connectivity with Optical Sub-Assembly", which is incorporated herein by reference in its entirety.

One problem associated with the design shown in FIG. 1 is that the connections between flex circuit 108, PCB 106, and TOSA 102 can be difficult and time consuming to make. Likewise, the connections between flex circuit 110, PCB 106 and ROSA 104 can also be difficult and time consuming to make. This increased time and complexity greatly increases the cost of the modules as a whole.

BRIEF SUMMARY OF EXEMPLARY EMBODIMENTS OF THE INVENTION

In order to overcome the limitations discussed above, exemplary embodiments of the present invention disclose an optoelectronic module. According to one aspect, the optoelectronic module is simple to fabricate and so reduces assembly time and cost. The optoelectronic module can include a flexible circuit mounted within the optoelectronic module's housing and connects to the laser and/or photodiode of the module. The flexible circuit also includes contacts or pads that facilitate connecting the module to an external device, such as a box or patch panel. In this manner, a single flexible structure is used instead of the combination of a rigid printed circuit board and multiple flexible circuits.

According to another aspect, the weight of the optoelectronic module is reduced through including the flexible circuit. The flexible circuit weighs less than a printed circuit board and so makes the overall weight of the optoelectronic module lesser than existing optoelectronic modules.

According to still another aspect, increased reliability of the optoelectronic module is achieved through performing testing of components prior to mounting within the optoelectronic module's housing. Since various electrical components, such as TOSAs, ROSAs, laser, and laser diodes, can mount directly to a flexible circuit of an optoelectronic module, testing procedures can be performed prior to mounting the flexible circuit within the optoelectronic module's housing. This increases the reliability of completed optoelectronic modules.

According to another aspect, an optoelectronic module is more resistant to vibration, jarring, or excessive movement than existing optoelectronic modules. A flexible circuit is capable of dampening the adverse affects of vibration, jarring, or excessive movement as optical cables are moved or attached and detached because the flexible circuit can flex. Unlike printed circuit boards that are substantially rigid, the flexible circuit can move under the influence of vibration, jarring, or excessive movement and so limit damage to the mounted electrical components. This prevents device breakage or loss of electrical or optical contact either from a single forceful event or from the gradual effects of vibration and optical cable attachment and detachment. This ability to move also provides an outlet for differential thermal contraction/expansion. Additionally, flexible circuits are more compliant than rigid printed circuit boards, which can enhance the fatigue life of solder joint connections to Ball Grid Array and Flip Chip array components in severe thermal cycle environments, such as are found in telecommunications applications.

According to another aspect, the flexible circuit provides an expanded surface area over printed circuit boards and so it is easier to construct the optoelectronic module using such circuits. Further, the flexible circuits allow the electrical components to be spaced farther apart and, since putting components closer together generally results in increased expense in both design and manufacture, the optoelectronic module is less expensive to produce and simpler to manufacture than existing modules.

Generally, the optoelectronic module can connect to patch panels and boxes that enable the transceiver module to optically and electrically communicate with an optical network. Associated with the optoelectronic module is a flexible circuit having a first surface and a second surface. Mounted to either or both of the first surface and the second surface are one or more electrical components. In addition, at least one of a laser and a photodiode are disposed on one of the flexible circuit. The flexible circuit also includes one or more contacts or pads that facilitate connection to the patch panel or box. The flexible circuit both connects to the patch panel or box and the laser and/or photodiode of the optoelectronic module.

According to one configuration, the optoelectronic module includes a housing that can receive the flexible circuit, the electrical components, the laser, and/or the photodiode. This housing is configured in accordance with one or more industry standards. For instance, the optoelectronic module, and hence the housing, can be of a small form factor pluggable type.

The optoelectronic module described herein can optionally include a protective material that covers at least one of the photodiode and the laser. The protective material can be an optically clear resin or epoxy that is applied as a liquid and hardens to create the protective material. When optically clear resins or epoxies are used, light can pass through the epoxy or resin into the photosensitive area of the photodiode or can alternately pass out of the active area of the laser and be guided into a fiber optic cable optionally through use of a suitable mechanical connector. The optically clear resin or epoxy prevents liquid moisture and contaminants from reaching the laser or photodiode surface and protects delicate wire bonds from handling damage.

In another alternate exemplary embodiment, optoelectronic module includes a flexible circuit and housing that conform to the Standard Form Factor Pluggable Multi-Source Agreement (MSA SFP) module standards. Disposed on the flexible circuit is a TOSA, a ROSA, and control circuitry. The TOSA and ROSA can be in a transistor outline (TO) header package. Alternately, the TOSA and ROSA can be fixed within the housing without a TO package.

In another exemplary embodiment, the flexible circuit and housing make up a standard transceiver module. This module can connect to a network using standard connectors, such as, but not limited to a GBIC connector, a 20 pin SFP connector, etc. The flexible circuit contains all of the circuitry to achieve operation of the module.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

Reference will now be made to FIGS. 2-6 wherein like structures will be provided with like reference designations. It is understood that the Figures are diagrammatic and schematic representations of various embodiments of the claimed invention, and are not to be construed as limiting the scope of the present invention in any way, nor are they necessarily drawn to scale.

Figure 2A:
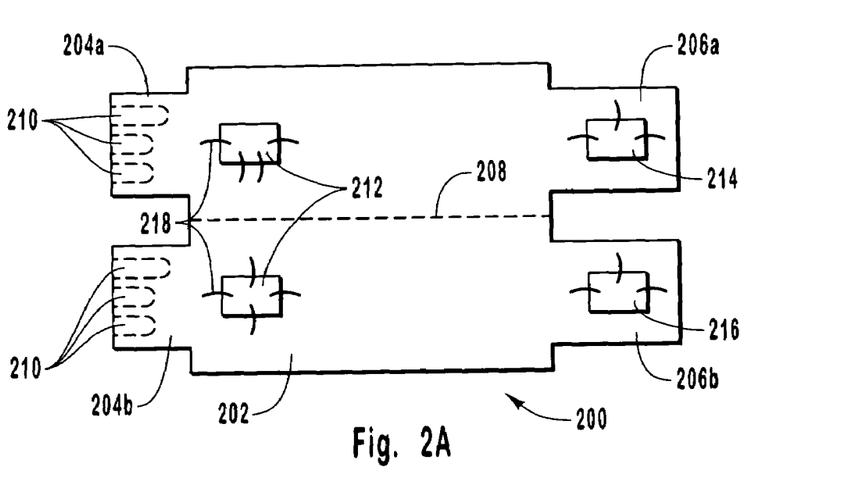
FIG. 2A shows a top view of a flexible circuit in accordance with one exemplary embodiment of the present invention.
Figure 2B:
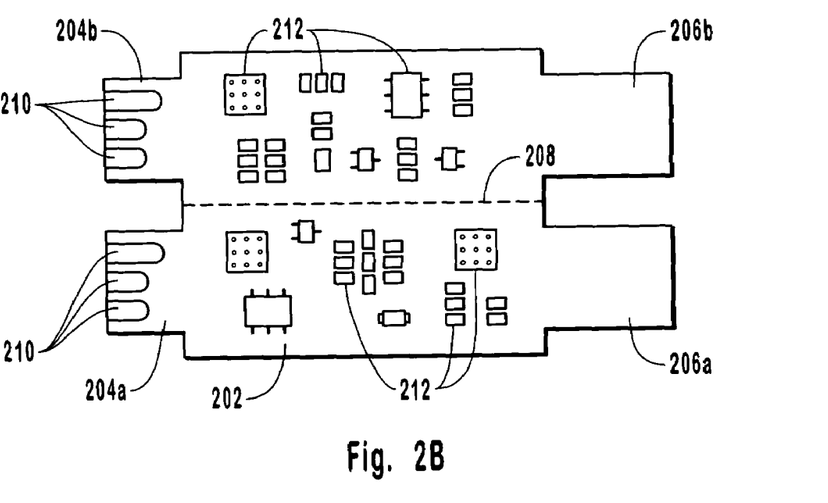
FIG. 2B shows one possible bottom view of the flexible circuit of FIG. 2.

With reference to FIGS. 2A and 2B, a flexible circuit 200 is shown. Flexible circuit 200 can be produced in several basic forms. These include, for example, single-sided flexible circuits, double-sided flexible circuits, and multilayer flexible circuits (having three or more conductor layers); the layers of the circuit interconnected with plated-through holes. Flexible circuit 200 includes a flexible member 202 that acts as a substrate for the electrical components mounted thereon. Generally, flexible circuit 200 is a patterned arrangement of electrical pathways deposited on flexible member 202, which has a flexible base material with or without flexible cover layers. The combination of flexible member 202 with the electrical traces, wires, waveguides, strips, slot lines, or the like formed in or deposited on the flexible member 202 may be considered flexible circuit 200. Further, flexible circuit 200 can also include the various electrical components mounted thereto.

In this exemplary embodiment, flexible member 202 has first and second elongated sections 204a, 204b on one end, and third and fourth elongated sections 206a, 206b, on an opposite end. Disposed on flexible member 202 are one or more electrical components 212, a laser 214, and a photodiode 216. It will be understood that the laser and the photodiode are also "electrical components" or "components". A plurality of wires 218 connects these components to electrical conductors in flexible member 202. Additionally, disposed on flexible member 202 are electrical connectors or pads 210 for connecting flexible circuit 200 to external devices, such as a router, network switch, mass storage device, computer, or other electrical component.

Flexible member 202 can be manufactured using a variety of materials such as polyimide, polyester, LCP, Teflon, or other material having the desired flexibility and strength characteristics. The specific flexible circuit embedded in flexible member 202 can be a waveguide design (for example microstrip, coplanar waveguide, slotline, or the like) to confine and propagate electromagnetic waves along flexible circuit 200. Microstrips have an unbalanced transmission trace structure. In one configuration, this structure can include a ground plane, such as a layer of copper or other conductive material, on the back side of a substrate of flexible circuit 202. This structure can further include the dielectric material of flexible circuit 202, and a relatively narrow strip on the top side of flexible circuit 202. When a microstrip is used with a 10 Gig circuit, the controlled impedance lines can be used for all signal lines of the circuit. These narrow strips can be the controlled impedance lines and can extend, in one example, from the photodiode to the post amplifier. Coplanar waveguides, as their name suggests, are formed on the planar surface of flexible circuit 202 with ground areas which parallel a signal trace on both sides of flexible circuit 202. One exemplary embodiment of the present invention uses microstrip or coplanar waveguide designs. However, any flexible circuit waveguide structure may be compatible with various aspects of the embodiments of the present invention.

To ensure that electrical components 212 function correctly, the proper impedance is chosen for flexible circuit 200. In the case of a microstrip, the impedance of a microstrip is determined by the width of the trace above the ground plane, the thickness of the substrate, and the dielectric of the substrate. For a coplanar waveguide, the impedance of a coplanar waveguide is determined by the overall size of the signal trace, substrate thickness and dielectric, and the width of the gaps on either side. Such design considerations are known to and routinely made by, one skilled in the art.

The specific exemplary configuration of flexible member 202 shown in FIGS. 2A and 2B can facilitate the placement of components on flexible member 202. This enables the folding and operation of flexible circuit 200. Although FIGS. 2A and 2B illustrate one configuration of flexible member 202, which allows for the performance of the flexible member 202, other configurations that allow for the connection of electrical components on flexible member 202, and that allow the flexible material to be folded to fit within the space provided in a module, are also possible. For instance, flexible member 202 can be square, rectangular, polygonal, circular, oval, or any other shape. The specific shape shown in FIGS. 2A and 2B is an exemplary embodiment only, and should not be construed to limit the invention in any way.

Each of the one or more electrical components 212 can be any of a number of standard or special purpose electrical devices forming part of flexible circuit 200. By way of example and not limitation, each of the one or more electrical components 212, illustrated in FIGS. 2A and 2B, can be a laser driver for laser 214, a post amplifier for photodiode 216, insulation displacement components (IDC), surface mount technology (SMT) components, chip-on-board (COB) components, resistors, capacitors, transducers, or other electrical components.

In the exemplary embodiment of FIG. 2A, electrical components 212 are COB components that can be placed on the surface(s) that will be folded to the inside of the folded flexible circuit 200. Regular "off the shelf" SMT components can also be placed on the surface that faces outward after folding flexible member 202, shown in FIG. 2B. Those skilled in the art will realize that this need not be the case, and any type of electrical component 212 can be placed anywhere on flexible member 202. The placement of certain electrical components 212 may be affected by the manufacturing process used to place or mount the electrical component.

In one configuration each type of component is placed by a different kind of equipment during the manufacturing process. Illustratively, COB process can involve taking an unpackaged semiconductor die, gluing it on flexible member 202, wirebonding the electrical connection to pads, such as, but not limited to, gold or other metallic pads, on flexible member 202, and then adding epoxy or resin potting material over the wirebonds and die to protect it from damage. The epoxy or resin potting material is sometimes known as "glop-top" material. The COBs are usually semiconductors designed and manufactured for a specific company. Such semiconductors are sometimes known as Application Specific Integrated Circuits (ASICs).

Utilizing the COB process reduces costs and eliminates paying third parties to pre-package the ASICs into an SMT package and mount the SMT package. FIG. 2B shows a number of SMT electrical components 212 mounted on a reverse side of flexible member 202 from the COBs. Each of electrical components 212 (whether COB, SMT or some other type of electrical component) can be fixed to the surface of flexible member 202 using, for example, adhesives designed for that or other purposes. Additionally, the components can be attached with solder, or any other attachment method that will fix electrical components 212 on flexible material 202.

In an alternate exemplary embodiment, SMT components can be attached to flexible member 202 by screen-printing solder paste on metal pads (not shown) plated on flexible member 202. The metal pads can be, by way of example and not limitation, gold, or silver, solder coated pads, or other metallic pads, whether coated or uncoated. Surface mount devices (SMDs) can be placed in the solder paste usually by an automated, vision controlled, and placement machine. The solder paste can act as a temporary adhesive to hold the parts on the board. After component placement, the assembly can pass into an oven, which heats the entire assembly to above the melting point of the solder, causing the solder to melt and mass form all of the solder joints. Alternately, conductive adhesive can be used instead of solder paste. The SMD components can be placed in the conductive adhesive and the assembly sent through an oven (much lower temperature than for soldering) where the conductive adhesive cures, bonding the components to the board. Such conductive adhesive can be, by way of example and not limitation, a silver loaded epoxy.

With continued reference to FIGS. 2A and 2B, each of the electrical components 212 can have one or more connecting wires 218. Connecting wires 218 bond to flexible member 202 of flexible circuit 200 using techniques known to those of skill in the art. These techniques can include, by way of example and not limitation, gold wire bonding to the electrical components 212 and to gold pads (not shown) plated on flexible material 202. Other types of metal or alloy wires and pads can also be used, whether or not the type of metal or alloy for the wire is the same as the type of metal for the pad. Illustratively, and in no way limiting the possibility of other metals or alloys, aluminum wire could be used to bond to the gold pads plated on flexible material 202. Wire bonding can occur, by way of example and not limitation, thermosonically, ultrasonically or thermally, using standard wirebonding equipment. Alternately, or in addition to wires 218, certain electrical components 212 can contact one or more traces to make the desired electrical connection.

Figure 3:
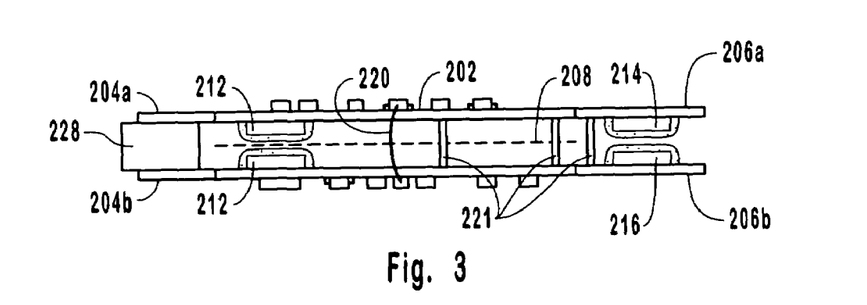
FIG. 3 shows the flexible circuit of FIGS. 2 and 3 folded over to fit in a module housing.

With reference now to FIG. 3, flexible circuit 200 is shown in a folded configuration. In this configuration, flexible member 202 is folded generally along a center line 208 (also shown in FIGS. 2A and 2B), so that electrical connectors 210 are on an outside of the folded structure. This configuration facilitates the easy connection of flexible circuit 200 to external devices. To assist with this connection, a stiffener 228 can optionally be inserted between first elongated section 204a and second elongated section 204b. By way of example and not limitation, the stiffener can be made of low cost printed circuit board material, such as phenolic material, waste epoxy-fiberglass laminate, or other suitable materials. The stiffener also serves the purpose of providing a firm surface to act as an "edge-card" connector in combination with electrical connectors 210. Many fiber-optic modules are "pluggable" meaning that they are intended to plug into a connector socket on a host router or switch motherboard using one edge of the printed circuit board as an "edge-card" connector. It will be understood that in other configurations, elongate section 204a and 204b may contact each other and function collectively as an "edge-card" connector without the use of a stiffener. Further, embodiments may utilize first elongated section 204a as one "edge-card" connector and second elongated section 204b as a second "edge-card" connector.

In addition to including structures to function as an "edge-card" connector, electrical connections can also be made across, around, or through flexible member 202 using, by way of example and not limitation, additional connecting wires 220 or pins 221. Those skilled in the art realize that there are machines which take a reel of pins and automatically drive a pin 221 through a pre-made hole in flexible member 202. These pins 221 can have a cross section that facilitates wedging the pin into flexible member 202. For instance, the pin can have a star cross section or some other cross section that facilitates attachment of the pin to the flexible member 212. One reason to use pins 221 instead of additional wires 220 is that sometimes, in high frequency applications, the long signal path used by the wires is not desired. The pins 221 provide a short path from one component to another.

While the exemplary embodiment of flexible circuit 200 is shown as folding in the middle to create a dual layered structure, those skilled in the art will realize that flexible circuit 200 can be fabricated from a flexible member that could be folded two or more times, depending on the configuration of the circuitry and the shape of flexible member 202. Additionally, the specific location of electrical components 212, whether SMT components, COB components, or other types of components, is arbitrary. It is anticipated that any configuration of electrical components disposed on a flexible circuit for use in a transceiver module falls within the scope of the exemplary embodiments of the present invention.

Figure 4:
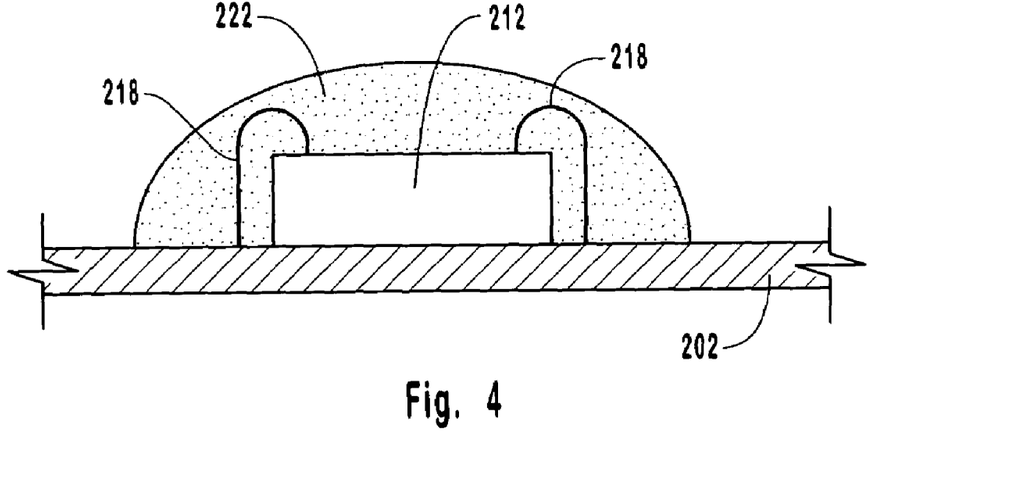
FIG. 4 shows a partial cross-sectional side view of an exemplary electrical component mounted on the flexible circuit of FIGS. 2A, 2B, and 3.

Some or all of electrical components 212 and connecting wires 218 can be fixed in place using epoxy or resin potting adhesive (glop top) methods known in the art. FIG. 4 shows electrical component 212 mounted to flexible member 202, with wires 218 connecting them. An epoxy or resin 222 can be added over electrical components 212 and connecting wire(s) 218 to ensure that the connections are fixed and electrical components 212 and flexible member 202 remain electrically connected when flexible member 202 is bent or otherwise manipulated. In an exemplary embodiment, resin or epoxy 222 can be applied as a liquid. Resin or epoxy 222 then hardens to provide protection to electrical components 212, i.e., becomes a protective material. Other materials, such as an optically clear adhesive can also be used to protect the electrical components 212 on flexible member 202.

Figure 5:
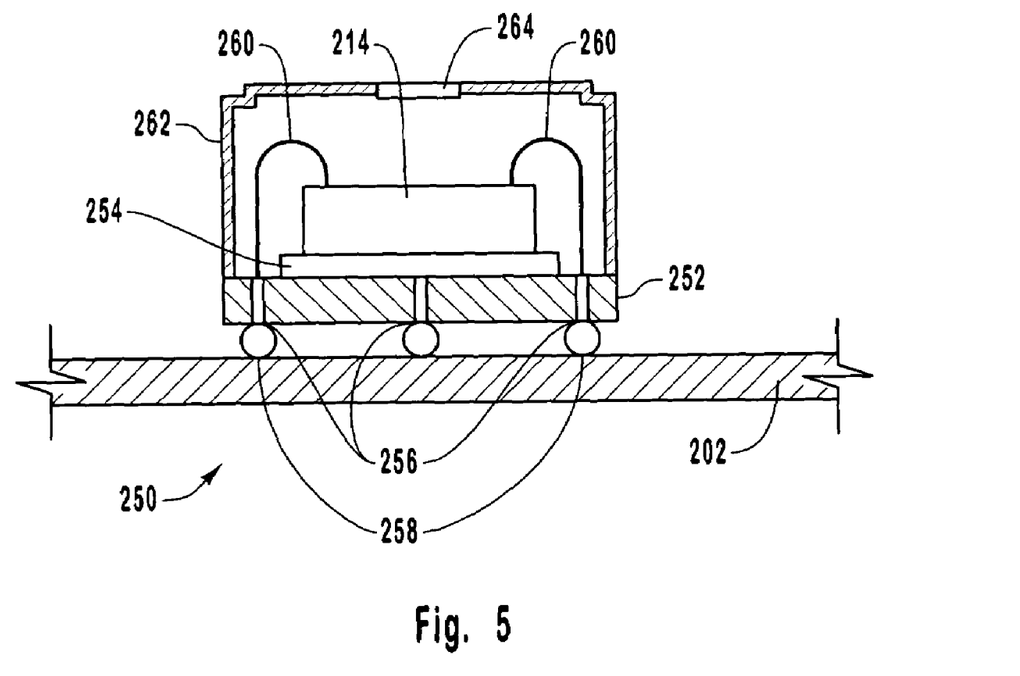
FIG. 5 shows a partial cross-sectional side view of one exemplary embodiment of an optical sub-assembly mounted on a flexible circuit according to an alternate aspect of the present invention.

One electrical component that can be mounted on flexible member 202 is laser 214 and more specifically, a laser package. FIG. 5 shows a side view of an exemplary laser package mounted on flexible member 202, the laser package designated generally as reference numeral 250. Laser package 250 includes laser die 214 mounted on a base or substrate 252 using, for example, an adhesive 254. Substrate 252 can include at least one hole 256 that electrically connects wires 260 with, by way of example and not limitation, ball grid array solder balls 258. Ball grid arrays are a newer type of package for integrated circuits with very high pin counts. It replaces the pins with small solder balls 258. The solder balls 258 are electrically connected to the underlying electrical circuits in flexible member 202. In this exemplary embodiment, balls 258 can be soldered in place using traditional surface mount assembly methods. Such methods can include, by way of example and not limitation, the use of a screen print solder paste. Laser die 214 can be placed into the solder paste, and heated to the melting point of the solder.

Laser package 250 can also include a can or housing 262 placed over laser diode 214 and connected to base or substrate 252. Housing 262 can have a window 264 to pass the optical signals generated by laser diode 264. Window 264 can be made form any material that will pass an optical signal in the frequency range generated by laser diode 214. In one exemplary embodiment, housing 262 can be a standard transistor outline (TO) header assembly known to those of skill in the art. The TO header can be made from a wide variety of materials, including but not limited to, metal, plastic, ceramic, hybrids, glass, synthetic materials, natural materials, and the like. In an exemplary embodiment, housing 262 can be made of metals such as Kovar or Alloy 42 so that clear glass window 264 can be hermetically sealed to the metal using the well known process of glass-to-metal sealing. The base or substrate 252 can be attached by seam welding the metal can or housing 262 to the base. Alternately the can may be soldered to the base using a high temperature solder. In another alternate embodiment, housing 262 can be being made from a ceramic material resulting in use of a ceramic-to-metal sealing.

While FIG. 5 illustrates a laser package using laser diode 214, those skilled in the art will realize that a similar design also works for photodiode 216 (FIGS. 2A, 2B and 3). Some type of rigid covering, such as a TO header, makes it easier to assemble an optoelectronic module and to fix in place the laser diode or photodiode. However, a rigid package or housing is not required. In alternate exemplary embodiments, the diodes can be fixed in place with no rigid package or housing. Alternately, while illustrated embodiments of the invention show lasers and/or photodiodes, it is also possible to use other electrical components, such as any electrical component used in electrical modules.

Figure 6:
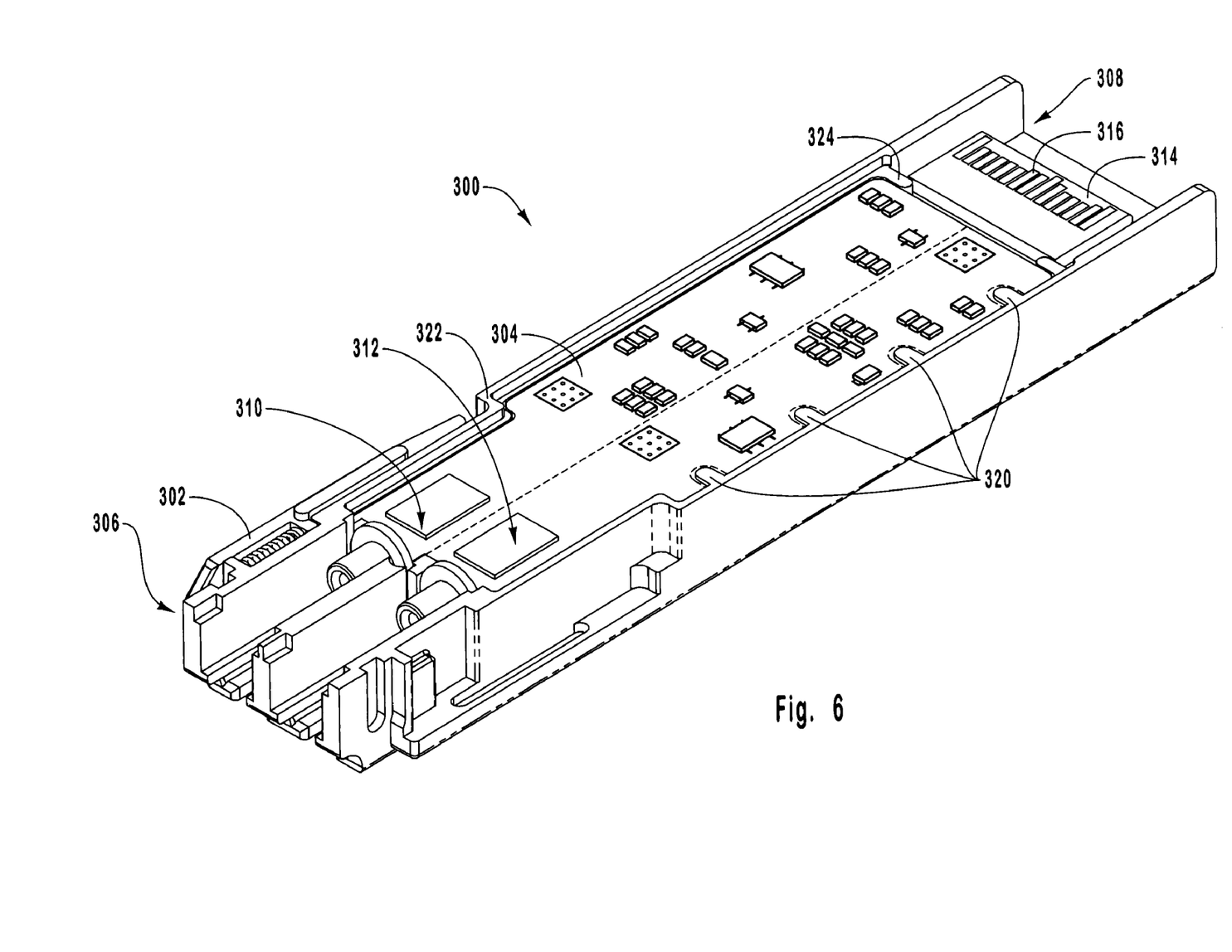
FIG. 6 shows a perspective view of one exemplary embodiment of an optoelectronic module constructed with a flexible circuit according to yet another aspect of the present invention.

FIG. 6 illustrates one exemplary configuration of an optoelectronic module constructed with a flexible circuit, designated generally with reference numeral 300. The module 300 includes a housing 302 and a folded over flexible circuit 304, which can be flexible circuit 200. The housing 302 of module 300 can include many of the features and structures of a standard module housing. Housing 302 includes a first end 306 that cooperates with one or more cables and a second end 308 that can cooperate with a network switch, router or mass storage device. The interior of housing 302 can securely receive flexible circuit 304 and other electrical components associated with module 300. Housing 302 can be constructed from metal, alloys, plastics, ceramic materials, or other materials known in the art.

In an exemplary embodiment, housing 302 conforms in size and shape to the Multisource Agreement Standard Form Factor Pluggable (MSA SFP) standard. In an alternate exemplary embodiment, housing 302 conforms in size and shape to the 10 Gb/s standard form factor pluggable (XFP) standard. However, those skilled in the art will realize that other sizes and configurations of housing 302 are also contemplated, including housings for electronic rather than optoelectronic modules.

Flexible circuit 304 mounts within housing 302. Disposed near one end of flexible circuit 304 are a transmitter optical sub-assembly (TOSA) 310 and a receiver optical sub-assembly (ROSA) 312. Disposed on an opposite end of flexible circuit 304 is an elongated section 314 having a plurality of electrical contacts or pads 316. Electrical contacts 316 are sized and configured to connect module 300 to external devices, such as electrical sockets mounted to network switches, routers, or mass storage devices. In an exemplary configuration, electrical contacts 316 are sized and configured to meet MSA SFP standards. In an alternate exemplary embodiment, electrical contacts 316 are sized and configured to meet the 10 Gb/s standard form factor pluggable (XFP) standard. However, those skilled in the art will realize that any other standards, including proprietary configurations, and non-standard contact architectures can be used and fall within the scope of embodiments of the present invention.

In this exemplary configuration, flexible circuit 304 is shown as being folded in half approximately lengthwise, in a similar configuration to flexible circuit 200 illustrated in FIG. 3. However, those skilled in the art will realize that flexible circuit 304, as shown in FIG. 6, need not be folded at all, or could be folded two or more times. As long as flexible circuit 304, and the electrical components disposed thereon are sized and configured to fit within housing 302, the requirements of this exemplary embodiment are satisfied.

To limit movement of flexible circuit 304, the interior of housing 302 generally mates with flexible circuit 304. For instance, housing 302 can include hold down tabs 320 that limit movement of flexible circuit 304. The hold down tabs 320 are configured to secure flexible circuit 304 in place within housing 302. These tabs 320 extend sufficiently into an interior of housing 302 to restrain flexible circuit 304. The tabs 614 can prevent movement of flexible circuit 304 in a direction parallel to and/or perpendicular to a longitudinal axis of housing 302. Housing 302 can also include other edges, tabs, or other structures to limit movement of flexible circuit 304, such as intermediate portions 322 and 324. Portion 322 limits movement of flexible circuit 304 towards front end 306, while portion 324 limits movement of flexible circuit 304 towards rear end 308. The interior of housing 302 may thus closely match a perimeter of the folded flexible circuit 304.

In addition to hold down tabs 320, other mechanical structures could be used to secure flexible circuit 304. Such mechanical structures can include, by way of example and not limitation, other tabs, ridges, prongs, slots, studs, or other structures designed to hold flexible circuit 304, TOSA 310, and ROSA 312 in a fixed position within housing 302. This allows external cables to be connected to TOSA 310 and ROSA 312 without disturbing the optical alignment necessary to pass signals from module 300 to external devices, such as, but not limited to, other modules at remote locations.

To assist in holding TOSA 310 and ROSA 312 in place, either or both can be disposed in a separate container package, and the package mounted to flexible circuit 304. Such a package could include, but is not limited to, a transistor outline (TO) header package. Those skilled in the art will realize that other container packages are also possible. Additionally, the optoelectronic module using flexible circuit 304 could also be a standard or proprietary electronic module with compatible components fixed on flexible circuit 304.

General advantages of the exemplary embodiments of flexible circuits disclosed herein include size and weight reduction, reduced assembly time and costs, increased system reliability, improved controlled impedance, improved heat dissipation, and three-dimensional packaging capability. Because flexible circuits can seamlessly integrate form, fit, and function, flexible circuits can provide an excellent means of reducing assembly time of a product. Other benefits are derived from the ability to reduce the number of assembly operations required, and from the user's ability to construct and test the circuit completely prior to committing the circuit to assembly.

Additionally, after assembly the flexible circuits protect the TOSAs, the ROSAs, and other electrical structures from vibration, jarring, or excessive movement as optical cables are moved or attached and detached. This prevents device breakage or loss of electrical or optical contact either from a single forceful event or from the gradual effects of vibration and optical cable attachment and detachment. This isolation also provides an outlet for differential thermal contraction/expansion.

Since the exemplary embodiments of flexible circuits disclosed herein have an expanded surface area over printed circuit boards, it is easier to construct transceiver modules using such circuits. Additionally, the flexible circuits allow the electrical components to be spaced farther apart. Since putting components closer together generally results in increased expense in both design and manufacture, the exemplary embodiments of the optoelectronic modules herein are less expensive to produce and simpler to manufacture.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module comprising:
   a housing:
   a flexible circuit comprising a foldable material, the flexible circuit mounted inside the housing, the foldable material having a first surface and a second surface and one or more electrical pathways;
   at least one electrical component disposed on at least one of said first surface and said second surface of the foldable material, each said at least one electrical component being electrically connected to at least one of said one or more electrical pathways;
   at least one of a laser and a photodiode disposed on one of said first surface and said second surface, said at least one of said laser and said photodiode being electrically connected to at least one of said one or more electrical pathways; and
   a plurality of electrical contacts, at least some of which are disposed proximate an edge of at least one of said first surface and said second surface, the plurality of electrical contacts being configured and arranged to comprise at least a portion of an edge-card connector when the flexible circuit is folded in a predetermined configuration, the edge-card connector providing an interface from the flexible circuit to a device external to the housing.

2. The optoelectronic module of claim 1, wherein said flexible circuit is attached to said housing.

3. The optoelectronic module of claim 1, wherein said electrical components and said at least one of said laser and said photodiode are covered with a protective material.

4. The optoelectronic module of claim 3, wherein said protective material is a liquid deposited resin that hardens into said protective material.

5. The optoelectronic module of claim 3, wherein said protective material is optically transparent.

6. The optoelectronic module of claim 1, wherein said electrical contacts comprise electrically conductive pads disposed on said at least one edge of both of said first surface and said second surface.

7. The optoelectronic module of claim 6, wherein an arrangement of said pads is substantially compliant with one of the small form factor pluggable (SFF) Multisource Agreement (MSA) or 10 Gb/s standard form factor pluggable (XFP) MSA when the flexible circuit is folded in the predetermined configuration.

8. An optoelectronic module comprising:
   a housing within which a laser and an optical receiver are disposed; and
   a flexible member including circuitry in communication with at least one of the laser and the optical receiver, the flexible member comprising a foldable material upon which the laser and optical receiver are disposed, the flexible member being disposed within said housing, said flexible member having an edge-card connector, the edge card connector comprising:
   a first group of contacts disposed proximate an edge of said flexible member; and
   a second group of contacts disposed proximate the edge of the flexible member;
   wherein at least one of the first group of contacts and the second group of contacts provide an interface with a host that is external to the housing.

9. The optoelectronic module of claim 8, wherein at least one component disposed within the housing is covered with a protective material.

10. The optoelectronic module of claim 8, wherein an arrangement of said electrical contacts is substantially compliant with one of the small form factor pluggable (SFF) Multisource Agreement (MSA) or 10 Gb/s standard form factor pluggable (XFP) MSA when the flexible circuit is folded in the predetermined configuration.

11. An optoelectronic module comprising;
   a housing;
   a folded flexible circuit disposed within said housing, the folded flexible circuit including substantially parallel first and second portions, the first portion being folded over the second portion;
   at least one of a laser and a photodiode electrically connected to said flexible circuit; and
   a pluggable edge-card connector that provides connectivity between the at least one of a laser and a photodiode and a device that is external to the housing, the pluggable edge-card connector comprising:
   a first plurality of electrical contacts disposed proximate an edge of said first portion; and
   a second plurality of electrical contacts disposed proximate an edge of said second portion.

12. The optoelectronic module of claim 11, wherein circuitry is disposed on each of said first and second portions.

13. The optoelectronic module of claim 11, wherein each portion of the folded flexible circuit includes a pair of substantially parallel surfaces, and circuitry is disposed on at least two of the four surfaces.

14. The optoelectronic module of claim 11, wherein at least one component of the flexible circuit is covered with a protective material.

15. The optoelectronic module of claim 11, wherein an arrangement of said electrical contacts is substantially compliant with one of the small form factor pluggable (SFF) Multisource Agreement (MSA) or 10 Gb/s standard form factor pluggable (XFP) MSA.

16. The optoelectronic module of claim 1, wherein the optoelectronic module is substantially compliant with one of: the Small Form-Factor Pluggable Transceiver Multi-Source Agreement (SFP MSA); and, the 10 Gigabit Small Form-Factor Pluggable MultiSource Agreement (XFP MSA).

17. The optoelectronic module of claim 1, wherein the optoelectronic module is compatible with a data rate of about 10 Gb/s.

18. A flexible circuit, comprising:
a flexible member comprising a foldable material, the flexible member mounted within a housing;
a plurality of electrical pathways attached to the flexible member;
at least one electrical component positioned on the foldable material and arranged for communication with at least one electrical pathway; and
first and second pluralities of electrical contacts disposed proximate an edge of said flexible member, the electrical contacts being configured and arranged to comprise at least a portion of an edge-card connector when the flexible circuit is folded in a predetermined configuration and being configured to provide an interface to a device external to the housing.

19. The flexible circuit as recited in claim 18, wherein the at least one electrical component comprises one of: a laser; and, a photodiode.

20. The flexible circuit as recited in claim 18, wherein the flexible member comprises one of: polyimide; polyester; polytetrafluoroethylene; and, liquid crystal polymer (LCP).

* * * * *

UNITED STATES PATENT AND TRADEMARK OFFICE
CERTIFICATE OF CORRECTION

PATENT NO.        : 7,275,937 B2
APPLICATION NO.   : 10/836728
DATED             : October 2, 2007
INVENTOR(S)       : Ellison It is certified that error appears in the above-identified patent and that said Letters Patent is hereby corrected as shown below:

Column 1
Lines 8-9, change "patent application" to --Patent Application--
Line 11, change "Package"," to --Package,"--
Line 24, change "sub-assembly" to --subassembly--
Line 25, change "sub-assembly" to --subassembly--

Column 2
Line 17, change "transistor-outline" to --transistor outline--
Line 31, change "linear-row" to --linear row--
Line 51, change "port" to --receptacles--
Line 53, change "port" to --receptacles--
Line 56, change "application" to --Application--
Line 59, change "Sub-Assembly"," to --Sub-Assembly,"--
Line 62, change "flex" to --flexible--
Line 64, change "flex" to --flexible--

Column 3
Line 10, change "connects" to --connected--
Line 67, change "are" to --is--

Column 4
Line 1, change "of the flexible circuit" to --of the surfaces of the flexible circuit--
Line 17, change "When optically" to --When an optically--
Line 18, change "resins or epoxies are" to --resin or epoxy is--
Line 26, change "embodiment," to --embodiment, the--
Line 37, change "20 pin" to --20-pin--
Line 65, change "2" to --2A--
Line 66, change "2" to --2A, 2B--

Signed and Sealed this

Twenty-eighth Day of September, 2010

David J. Kappos
*Director of the United States Patent and Trademark Office*

Column 5
Line 5, change "sub-assembly" to --subassembly--
Line 28, change "plated-through" to --plated through--
Line 36, change "slot lines" to --slotlines--
Lines 46-47, change ""components"." to --"components."--
Line 64, change "202" to --200--
Line 65, change "202" to --200--
Line 66, change "202" to --200--

Column 6
Line 5, change "202" to --200--
Line 6, change "202" to --200--
Line 61, change "COB" to --the COB--

Column 7
Line 32, change "much" to --at a much--
Line 44, change "flexible material" to --flexible member--
Line 59, change "210" to --210 (not shown in Fig. 3)--

Column 8
Line 7, change "elongate section" to --elongated sections--
Line 24, change "member 212" to --member 202--
Line 63, change "laser die" to --laser--

Column 9
Line 8, change "Laser die" to --Laser--
Line 12, change "laser diode" to --laser--
Line 14, change "laser diode 264" to --laser 214--
Line 15, change "form" to --from--
Line 16, change "laser diode" to --laser--
Line 23, change "Alloy 42" to --Alloy 42--
Line 32, change "laser diode" to --laser--
Line 34, change "2A, 2B" to --2A--

Column 10
Lines 3-4, change both instances of "sub-assembly" to --subassembly--
Line 36, change "614" to --320--
Line 42, change "front" to --first--
Line 43, change "rear" to --second--

Column 12
Claim 8, line 28, change "edge card" to --edge-card--
Claim 8, line 34, change "provide" to --provides--

Column 14
Claim 19, lines 14-15, change "a laser; and, a" to --a laser and a--
Claim 20, line 18, change "and," to --and--